(12) United States Patent
Hui et al.

(10) Patent No.: US 11,018,696 B2
(45) Date of Patent: May 25, 2021

(54) SOFT OUTPUT DECODING OF POLAR CODES

(71) Applicant: Telefonaktiebolaget LM Ericsson (publ), Stockholm (SE)

(72) Inventors: Dennis Hui, Sunnyvale, CA (US); Yufei Blankenship, Kildeer, IL (US)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 64 days.

(21) Appl. No.: 16/337,952

(22) PCT Filed: Sep. 30, 2017

(86) PCT No.: PCT/IB2017/056051
§ 371 (c)(1),
(2) Date: Mar. 29, 2019

(87) PCT Pub. No.: WO2018/060976
PCT Pub. Date: Apr. 5, 2018

(65) Prior Publication Data
US 2020/0028522 A1     Jan. 23, 2020

Related U.S. Application Data

(60) Provisional application No. 62/402,783, filed on Sep. 30, 2016.

(51) Int. Cl.
H03M 13/11     (2006.01)
H03M 13/29     (2006.01)
H03M 13/37     (2006.01)

(52) U.S. Cl.
CPC .... *H03M 13/1111* (2013.01); *H03M 13/1191* (2013.01); *H03M 13/2981* (2013.01); *H03M 13/3776* (2013.01)

(58) Field of Classification Search
CPC .................................................. H03M 13/1111
USPC ........................................................ 714/746
See application file for complete search history.

(56) References Cited

U.S. PATENT DOCUMENTS

| | | | | |
|---|---|---|---|---|
| 10,153,787 B2* | 12/2018 | El-Khamy | ............ | H03M 13/13 |
| 10,312,946 B2* | 6/2019 | Wang | ................ | H03M 13/2927 |
| 10,673,467 B2* | 6/2020 | El-Khamy | ............ | H04L 1/0045 |
| 2015/0333775 A1* | 11/2015 | Korb | ..................... | H03M 13/13 |
| | | | | 714/780 |
| 2016/0013810 A1* | 1/2016 | Gross | ..................... | H03M 13/13 |
| | | | | 714/776 |
| 2016/0056843 A1* | 2/2016 | Gross | ................ | H03M 13/6561 |
| | | | | 714/781 |

(Continued)

OTHER PUBLICATIONS

PCT International Search Report for International application No. PCT/IB2017/056051—dated Jan. 24, 2018.

(Continued)

*Primary Examiner* — Fritz Alphonse
(74) *Attorney, Agent, or Firm* — Baker Botts, LLP

(57) ABSTRACT

According to certain embodiments, a method is provided for generating soft information for code bits of polar codes. The method includes receiving, by a decoder of a receiver, soft information associated with coded bits from a first module of the receiver and using a tree structure of the polar code to generate updated soft information. The updated soft information is output by the decoder for use by a second module of the receiver.

28 Claims, 15 Drawing Sheets

(56) References Cited

U.S. PATENT DOCUMENTS

2018/0226999 A1* 8/2018 Wang ............... H03M 13/3753

OTHER PUBLICATIONS

PCT Written Opinion of the International Searching Authority for International application No. PCT/IB2017/056051—dated Jan. 24, 2018.
Parallel Concatenated Systematic Polar Codes by Dongsheng Wu et al.; Electronics Letter, vol. 52, No. 1, pp. 43-45—Jan. 8, 2016.
Hardware Implementation of a Soft Cancellation Decoder for Polar Codes by Guillaume Berhault et al.—Sep. 2015.
Polar Codes for Partial Response Channels by Ubaid U. Fayyaz et al.; IEEE ICC 2013—Selected Areas in Communications Symposium—2013.
A High Throughput Belief Propagation Decoder Architecture for Polar Codes by Jun Lin et al.—IEEE 2016.
Polar Codes: A Pipelined Implementation by Erdal Arikan; Presented at 4th International Symposium on Broadband Communication (ISBC 2010), Melaka, Malaysia—Jul. 11-14, 2010.

\* cited by examiner

FIGURE 10
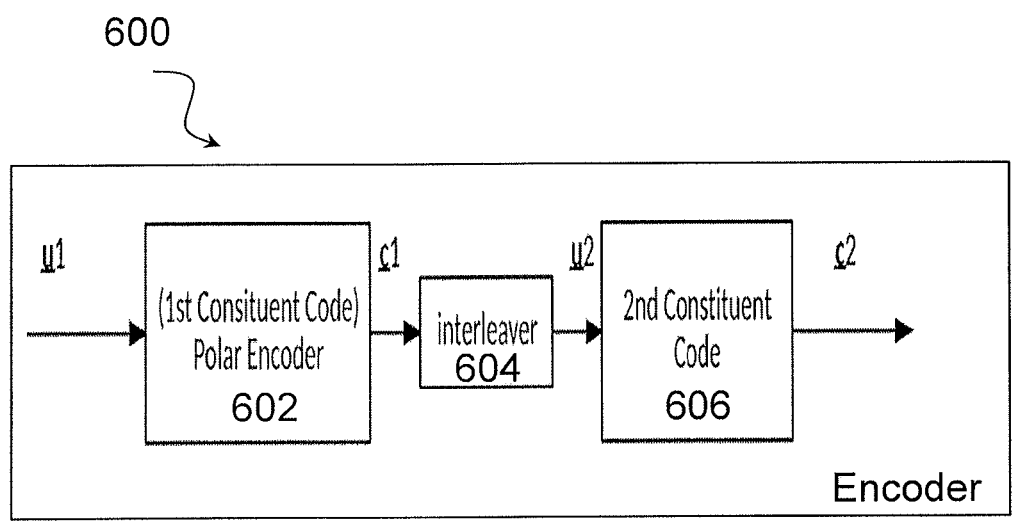
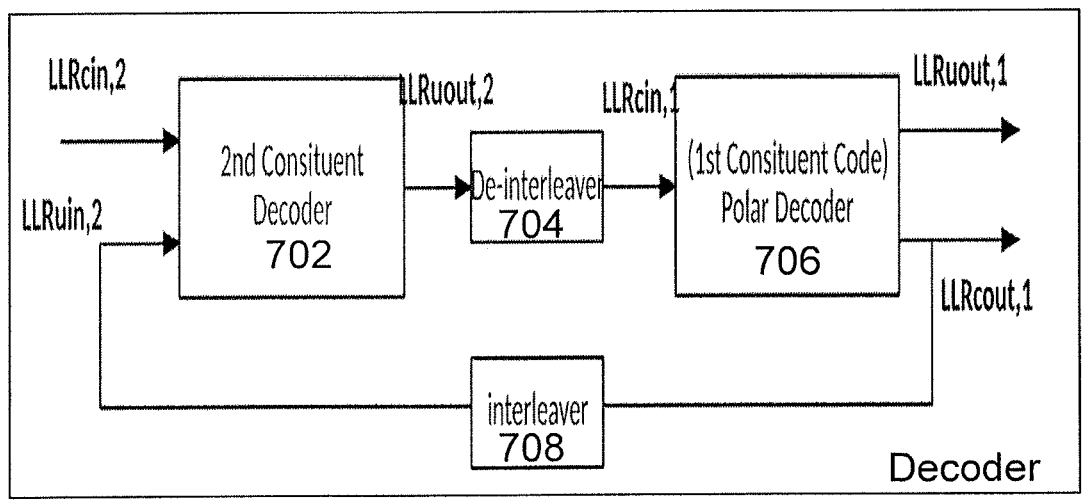
FIGURE 11 under 35 U.S.C. § 371 of International Patent Application Serial No. PCT/IB2017/056051 filed Sep. 30, 2017 and entitled "Soft Output Decoding of Polar Codes" which claims priority to U.S. Provisional Patent Application No. 62/402,783 filed Sep. 30, 2016 both of which are hereby incorporated by reference in their entirety.

SOFT OUTPUT DECODING OF POLAR CODES

PRIORITY

This nonprovisional application is a U.S. National Stage Filing under 35 U.S.C. § 371 of International Patent Application Serial No. PCT/IB2017/056051 filed Sep. 30, 2017 and entitled "Soft Output Decoding of Polar Codes" which claims priority to U.S. Provisional Patent Application No. 62/402,783 filed Sep. 30, 2016 both of which are hereby incorporated by reference in their entirety.

TECHNICAL FIELD

The present disclosure relates, in general, to wireless communications and, more particularly, systems and methods for soft output generation for code bits of polar codes.

BACKGROUND polar codes are discussed in E. Arikan, "Channel polarization: A Method for Constructing Capacity-Achieving Codes for Symmetric Binary-Input Memoryless Channels," IEEE Transactions on Information Theory, vol. 55, pp. 3051-3073, July 2009. polar codes are the first class of constructive coding schemes that are provable to achieve the symmetric capacity of the binary-input discrete memoryless channels under a low-complexity successive cancellation (SC) decoder. However, the finite-length performance of polar codes under SC is not competitive compared to other modern channel coding schemes such as low-density parity-check (LDPC) codes and Turbo codes. Subsequently, a SC list (SCL) decoder was proposed in, for example, I. Tal and A. Vardy, "List Decoding of polar codes," in Proceedings of IEEE Symp. Inf. Theory, pp. 1-5, 2011, which can approach the performance of optimal maximum-likelihood (ML) decoder. By concatenating a simple CRC coding, it was shown that the performance of concatenated polar code is competitive with that of well-optimized LDPC and Turbo codes. As a result, polar codes are being considered as a candidate for future 5G wireless communication systems.

The main idea of polar coding is to transform a pair of identical binary-input channels into two distinct channels of different qualities, one better and one worse than the original binary-input channel. By repeating such a pair-wise polarizing operation on a set of $2^M$ independent uses of a binary-input channel, a set of $2^M$ "bit-channels" of varying qualities can be obtained. Some of these bit channels are nearly perfect (i.e. error free) while the rest of them are nearly useless (i.e. very noisy). The point is to use the nearly perfect channel to transmit data to the receiver while setting the input to the useless channels to have fixed or frozen values (e.g. 0) known to the receiver. For this reason, those input bits to the nearly useless and the nearly perfect channel are commonly referred to as frozen bits and non-frozen (or information) bits, respectively. Only the non-frozen bits are used to carry data in a polar code.

FIG. 1 illustrates the structure of a polar code of a length of eight (N=8), and FIG. 2 illustrates a polar code encoder with a length of eight (N=8). Specifically, FIG. 2 illustrates the labeling of the intermediate info bits $s_{l,i}$, where $l \in \{0, 1, \ldots, n\}$ and $i \in \{0, 1, \ldots, N-1\}$ during polar encoding with a polar coder of length eight (N=8) The intermediate info bits are related by the following equation:

$$s_{l+1,i} = s_{l,i} \oplus s_{l,i+2^l}, \text{ for}$$

$$i \in \left\{ j \in \{0, 1, \ldots, N-1\}: \mathrm{mod}\left(\left\lfloor \frac{j}{2^l} \right\rfloor, 2\right) = 0 \right\}$$

$$s_{l+1,i+2^l} = s_{l,i+2^l}, \text{ for}$$

$$i \in \left\{ j \in \{0, 1, \ldots, N-1\}: \mathrm{mod}\left(\left\lfloor \frac{j}{2^l} \right\rfloor, 2\right) = 1 \right\}$$

with $s_{0,i} \equiv u_i$ be the info bits, and $s_{n,i} \equiv x_i$ be the code bits, for $i \in \{0, 1, \ldots, N-1\}$.

FIG. 3 illustrates an example butterfly based decoder for the case of N=8. Messages passed in the decoder are log likelihood ratio (LLR) values denoted as $L_{l,i}$, where l and i correspond to the graph stage index and row index, respectively. In addition, $L_{n,i}$ is the LLR directly calculated from the channel output $y_i$. The basic components of the decoder are two functions given by:

$$L_{l-1,i} = f(L_{l,i}, L_{l,i+2^l}) \triangleq 2\tanh^{-1}(\tanh(L_{l,i}/2)\tanh(L_{l,i+2^l}/2)) \text{ if } B(l,i)=0$$

$$L_{l-1,i} = g(\hat{s}_{l,i-2^l}, L_{l,i}, L_{l,i-2^l}) \triangleq (-1)^{\hat{s}_{l,i-2^l}} + L_{l,i} \text{ if } B(l,i)=1$$

for $l \in \{0, 1, \ldots, n-1\}$ and $i \in \{0, 1, \ldots, N-1\}$, where B(l,t) denotes the lth significant bit in the binary representation of i, and where $\hat{s}_{l,i}$ denotes an estimate of the intermediate info bit $s_{l,i}$.

FIG. 4 illustrates how the computations of the LLR values ($L_{l,i}$) are typically scheduled in the butterfly-based SC decoder for the case of N=8, where CC denotes the clock cycle. The functions $f(\cdot,\cdot)$ and $g(\cdot,\cdot)$ are called at different clock cycles. The scheduling is done in such a way that the results generated from one CC provide the necessary information for the computations in the subsequent CCs.

Existing polar decoder types include successive cancellation (SC), list decoding of SC (SCL), etc. The existing polar decoders do not generate soft output of code bits, which are used in successive interference cancellation (SIC) receivers. SIC is an important technique for improving receiver performance in many scenarios. SIC is used in iterative demodulation and decoding of MIMO, for example, where soft coded bits can be used to generate a soft estimate of the modulated symbols of previously decoded data stream (s), which can be removed or canceled from the received signal before the next data stream is decoded.

SUMMARY

To address the foregoing problems with existing solutions, disclosed is systems and methods for soft output generation for code bits of polar codes.

According to certain embodiments, a method is provided for generating soft information for code bits of polar codes. The method includes receiving, by a decoder of a receiver, soft information associated with coded bits from a first module of the receiver and using a tree structure of the polar code to generate updated soft information. The updated soft information is output by the decoder for use by a second module of the receiver.

According to certain embodiments, a decoder in a receiver for the soft output generation for code bits of polar codes is provided. The decoder includes memory storing instructions and processing circuitry operable to execute the instructions to cause the decoder to receive soft information associated with coded bits from a first module and use a tree structure of the polar code to generate updated soft information. The updated soft information is output by a decoder of the receiver for use by a second module of the receiver.

Certain embodiments of the present disclosure may provide one or more technical advantages. For example, certain embodiments may allow the soft output of polar coded bits to be utilized by other processors, modules, or components of the receiver. Another technical advantage may be that if polar code is used as a constituent code of the encoding process of the transmitter, the soft output of polar coded bits can be utilized by other constituent codes in the decoder. Still another technical advantage may be that the soft output of the coded bits is necessary for MIMO successive interference cancellation (SIC) receivers. In addition to MIMO SIC receivers, soft output of coded bits may also be used in advanced receivers with iterative demodulation and decoding, where the soft outputs between the demodulator and the channel decoder are iteratively exchanged to approach the performance of joint demodulation and decoding. For example, the soft coded bits can be used as a priori information when the demodulation attempts to improve its detection performance through re-demodulation of the received signal.

Other advantages may be readily apparent to one having skill in the art. Certain embodiments may have none, some, or all of the recited advantages.

BRIEF DESCRIPTION OF THE DRAWINGS

For a more complete understanding of the disclosed embodiments and their features and advantages, reference is now made to the following description, taken in conjunction with the accompanying drawings, in which:

FIG. 10 illustrates an encoder in a transmitter for handling serially concatenated codes, according to certain embodiments;

FIG. 11 illustrates a decoder in a receiver for handling serially concatenated codes, in accordance with certain embodiments;

DETAILED DESCRIPTION

Certain embodiments described herein include functionality for generating code bit log likelihood ratios (LLRs) of polar codes. The basic idea is to reuse the multi-stage structure of LLR calculations in the decoder in the reverse direction to generate the code bit LLRs once the relevant info bit LLRs become available during the decoding process. In a typical SC or SCL decoder, the soft value of LLR of each info bit is discarded after it is generated and used to make hard decision on that info bit.

According to certain embodiments, these soft values are stored and propagated stage-by-stage in the reverse direction, in a similar manner as the propagation of the hard decisions made regarding the corresponding info bits. Such reverse propagation of LLRs may be performed in a batch mode after the LLRs of all info bits have been calculated. Alternatively, the reverse propagation of LLRs may be integrated into the decoding process to reduce latency. This reverse LLR propagation process in effect achieves soft re-encoding of the soft info bits. Thus, in the end of reverse LLR propagation, soft output of the code bits is obtained.

Figure 5:
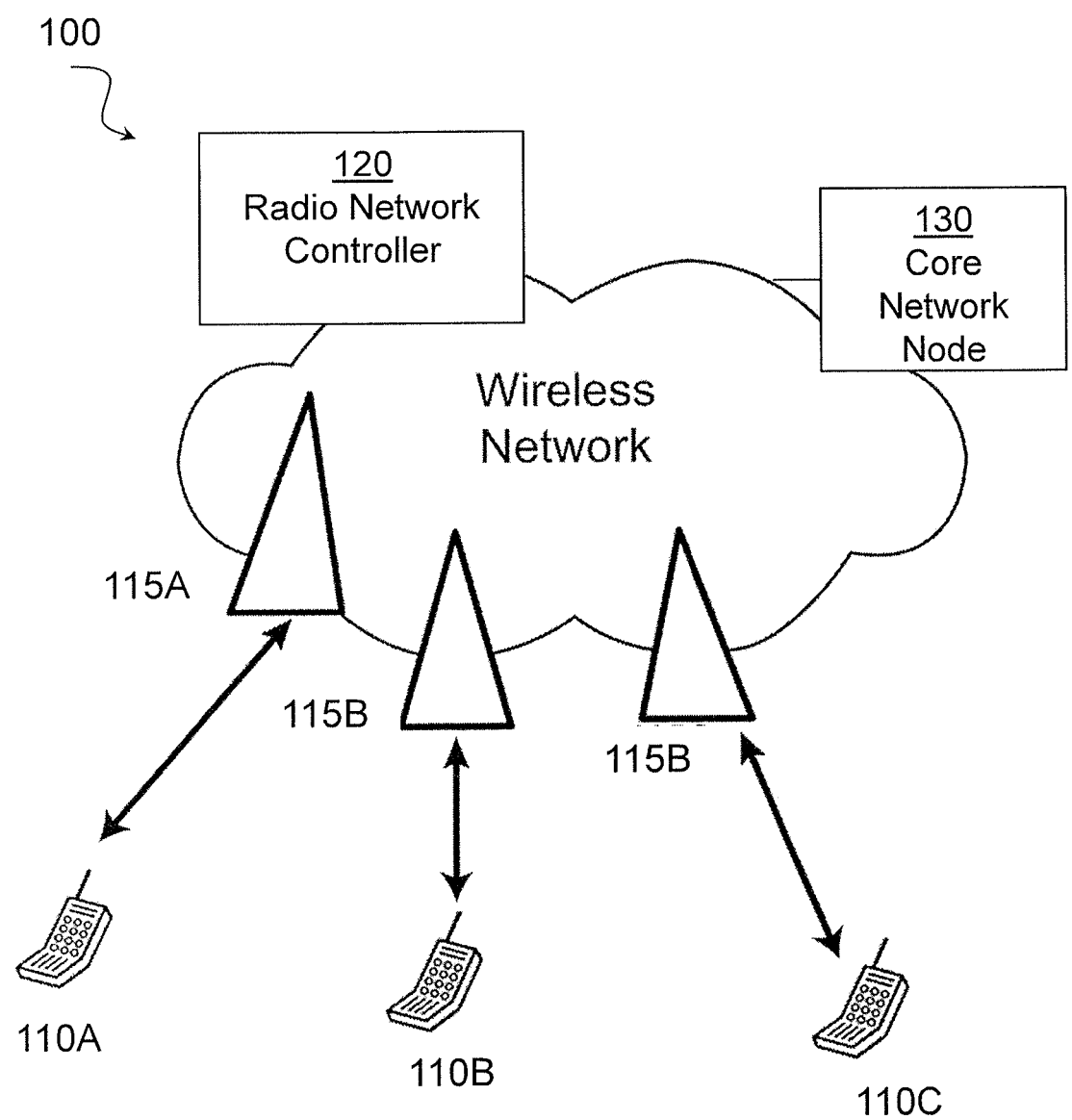
FIG. 5 illustrates an exemplary wireless network for generating soft information for code bits of polar codes, in accordance with certain embodiments.

Particular embodiments are described in FIGS. 1-16 of the drawings, like numerals being used for like and corresponding parts of the various drawings. FIG. 5 is a block diagram illustrating an embodiment of a wireless network 100 for generating soft information for code bits of polar codes, in accordance with certain embodiments. Network 100 includes one or more wireless devices 110A-C, which may be interchangeably referred to as wireless devices 110 or UEs 110, and network nodes 115A-C, which may be interchangeably referred to as network nodes 115 or eNodeBs 115, radio network controller 120, and a core network node 130. A wireless device 110 may communicate with network nodes 115 over a wireless interface. For example, wireless device 10A may transmit wireless signals to one or more of network nodes 115, and/or receive wireless signals from one or more of network nodes 115. The wireless signals may contain voice traffic, data traffic, control signals, and/or any other suitable information. In some embodiments, an area of wireless signal coverage associated with a network node 115 may be referred to as a cell. In some embodiments, wireless devices 110 may have D2D capability. Thus, wireless devices 110 may be able to receive signals from and/or transmit signals directly to another wireless device 110. For example, wireless device 110A may be able to receive signals from and/or transmit signals to wireless device 110B.

In certain embodiments, network nodes 115 may interface with a radio network controller 120. Radio network controller 120 may control network nodes 115 and may provide certain radio resource management functions, mobility management functions, and/or other suitable functions. In certain embodiments, radio network controller 120 may interface with core network node 130 via an interconnecting network 125. The interconnecting network 125 may refer to any interconnecting system capable of transmitting audio, video, signals, data, messages, or any combination of the preceding. The interconnecting network may include all or a portion of a public switched telephone network (PSTN), a public or private data network, a local area network (LAN), a metropolitan area network (MAN), a wide area network (WAN), a local, regional, or global communication or computer network such as the Internet, a wireline or wireless network, an enterprise intranet, or any other suitable communication link, including combinations thereof.

Core network node 130 may manage the establishment of communication sessions and provide various other functionality for wireless communication device 110. Wireless communication device 110 exchanges certain signals with core network node 130 using the non-access stratum layer. In non-access stratum (NAS) signaling, signals between wireless communication device 110 and core network node 130 pass transparently through network nodes 120.

As described above, example embodiments of network 100 may include one or more wireless devices 110, and one or more different types of network nodes capable of communicating (directly or indirectly) with wireless devices 110. Wireless device 110 may refer to any type of wireless device communicating with a node and/or with another wireless device in a cellular or mobile communication system. Examples of wireless device 110 include a mobile phone, a smart phone, a PDA (Personal Digital Assistant), a portable computer (e.g., laptop, tablet), a sensor, a modem, a machine-type-communication (MTC) device/machine-to-machine (M2M) device, laptop embedded equipment (LEE), laptop mounted equipment (LME), USB dongles, a D2D capable device, or another device that can provide wireless communication. A wireless device 110 may also be referred to as UE, a station (STA), a device, or a terminal in some embodiments. Also, in some embodiments, generic terminology, "radio network node" (or simply "network node") is used. It can be any kind of network node, which may comprise a Node B, base station (BS), multi-standard radio (MSR) radio node such as MSR BS, eNode B, network controller, radio network controller (RNC), base station controller (BSC), relay donor node controlling relay, base transceiver station (BTS), access point (AP), transmission points, transmission nodes, RRU, RRH, nodes in distributed antenna system (DAS), core network node (e.g. MSC, MME etc.), O&M, OSS, SON, positioning node (e.g. E-SMLC), MDT, or any suitable network node. Each of wireless communication device 110, network node 115, radio network controller 120, and core network node 130 include any suitable combination of hardware and/or software. Example embodiments of network nodes 115, wireless devices 110, and other network nodes (such as radio network controller or core network node) are described in more detail with respect to FIGS. 6, 7, and 13, respectively.

Although FIG. 5 illustrates a particular arrangement of network 100, the present disclosure contemplates that the various embodiments described herein may be applied to a variety of networks having any suitable configuration. For example, network 100 may include any suitable number of wireless devices 110 and network nodes 115, as well as any additional elements suitable to support communication between wireless devices or between a wireless device and another communication device (such as a landline telephone). In certain embodiments, wireless communication device 110, network node 120, and core network node 130 use any suitable radio access technology, such as long term evolution (LTE), LTE-Advanced, UMTS, HSPA, GSM, cdma2000, WiMax, WiFi, another suitable radio access technology, or any suitable combination of one or more radio access technologies. For purposes of example, various embodiments may be described within the context of certain radio access technologies. However, the scope of the disclosure is not limited to the examples and other embodiments could use different radio access technologies.

Figure 6:
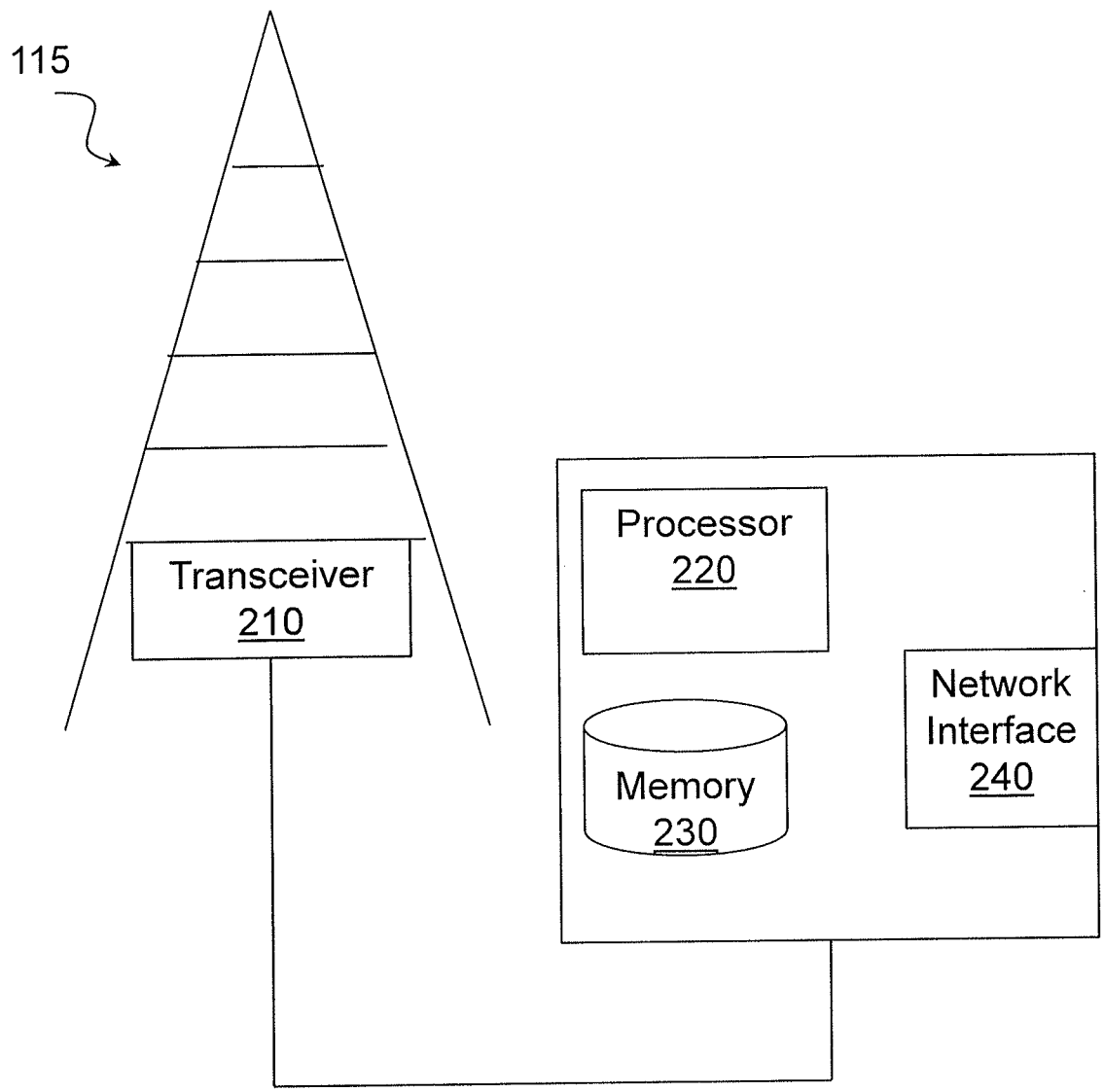
FIG. 6 illustrate an exemplary network node for generating soft information for code bits of polar codes, in accordance with certain embodiments.

FIG. 6 illustrate an example network node 115 for generating soft information for code bits of polar codes, according to certain embodiments. As described above, network node 115 may be any type of radio network node or any network node that communicates with a wireless device and/or with another network node. Examples of a network node 115 are provided above.

Network nodes 115 may be deployed throughout network 100 as a homogenous deployment, heterogeneous deployment, or mixed deployment. A homogeneous deployment may generally describe a deployment made up of the same (or similar) type of network nodes 115 and/or similar coverage and cell sizes and inter-site distances. A heterogeneous deployment may generally describe deployments using a variety of types of network nodes 115 having different cell sizes, transmit powers, capacities, and inter-site distances. For example, a heterogeneous deployment may include a plurality of low-power nodes placed throughout a macro-cell layout. Mixed deployments may include a mix of homogenous portions and heterogeneous portions.

Network node 115 may include one or more of transceiver 210, processor 220, memory 230, and network interface 240. In some embodiments, transceiver 210 facilitates transmitting wireless signals to and receiving wireless signals from wireless device 110 (e.g., via an antenna), processor 220 executes instructions to provide some or all of the functionality described above as being provided by a network node 115, memory 230 stores the instructions executed by processor 220, and network interface 240 communicates signals to backend network components, such as a gateway, switch, router, Internet, Public Switched Telephone Network (PSTN), core network nodes or radio network controllers, etc.

In certain embodiments, network node 115 may be capable of using multi-antenna techniques, and may be equipped with multiple antennas and capable of supporting MIMO techniques. The one or more antennas may have controllable polarization. In other words, each element may have two co-located sub elements with different polarizations (e.g., 90 degree separation as in cross-polarization), so that different sets of beamforming weights will give the emitted wave different polarization.

Processor 220 may include any suitable combination of hardware and software implemented in one or more modules to execute instructions and manipulate data to perform some or all of the described functions of network node 115. In some embodiments, processor 220 may include, for example, one or more computers, one or more central processing units (CPUs), one or more microprocessors, one or more applications, and/or other logic.

Memory 230 is generally operable to store instructions, such as a computer program, software, an application including one or more of logic, rules, algorithms, code, tables, etc. and/or other instructions capable of being executed by a processor. Examples of memory 230 include computer memory (for example, Random Access Memory (RAM) or Read Only Memory (ROM)), mass storage media (for example, a hard disk), removable storage media (for example, a Compact Disk (CD) or a Digital Video Disk (DVD)), and/or any other volatile or non-volatile, non-transitory computer-readable and/or computer-executable memory devices that store information.

In some embodiments, network interface 240 is communicatively coupled to processor 220 and may refer to any suitable device operable to receive input for network node 115, send output from network node 115, perform suitable processing of the input or output or both, communicate to other devices, or any combination of the preceding. Network interface 240 may include appropriate hardware (e.g., port, modem, network interface card, etc.) and software, including protocol conversion and data processing capabilities, to communicate through a network.

Other embodiments of network node 115 may include additional components beyond those shown in FIG. 6 that may be responsible for providing certain aspects of the radio network node's functionality, including any of the functionality described above and/or any additional functionality (including any functionality necessary to support the solutions described above). The various different types of network nodes may include components having the same physical hardware but configured (e.g., via programming) to support different radio access technologies, or may represent partly or entirely different physical components. Additionally, the terms first and second are provided for example purposes only and may be interchanged.

Figure 7:
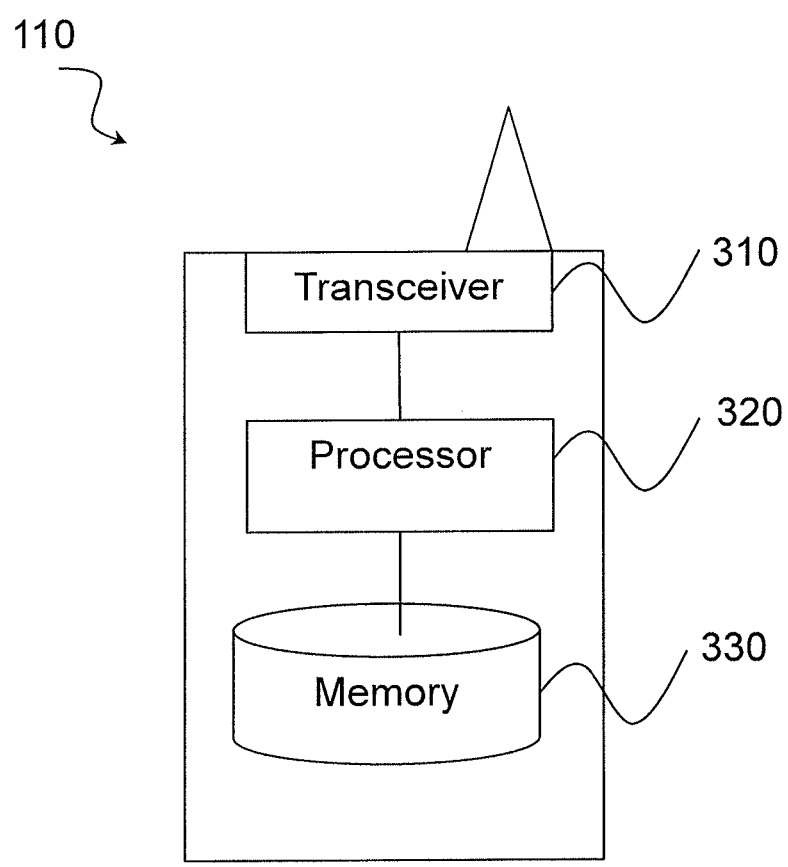
FIG. 7 illustrates an exemplary wireless device for generating soft information for code bits of polar codes, in accordance with certain embodiments.

FIG. 7 illustrates an example wireless device 110 for generating soft information for code bits of polar codes, in accordance with certain embodiments. As depicted, wireless device 110 includes transceiver 310, processor 320, and memory 330. In some embodiments, transceiver 310 facilitates transmitting wireless signals to and receiving wireless signals from network node 115 (e.g., via an antenna), processor 320 executes instructions to provide some or all of the functionality described above as being provided by wireless device 110, and memory 330 stores the instructions executed by processor 320. Examples of a wireless device 110 are provided above.

Processor 320 may include any suitable combination of hardware and software implemented in one or more modules to execute instructions and manipulate data to perform some or all of the described functions of wireless device 110. In some embodiments, processor 320 may include, for example, one or more computers, one or more central processing units (CPUs), one or more microprocessors, one or more applications, and/or other logic.

Memory 330 is generally operable to store instructions, such as a computer program, software, an application including one or more of logic, rules, algorithms, code, tables, etc. and/or other instructions capable of being executed by a processor. Examples of memory 330 include computer memory (for example, Random Access Memory (RAM) or Read Only Memory (ROM)), mass storage media (for example, a hard disk), removable storage media (for example, a Compact Disk (CD) or a Digital Video Disk (DVD)), and/or or any other volatile or non-volatile, non-transitory computer-readable and/or computer-executable memory devices that store information.

Other embodiments of wireless device 110 may include additional components beyond those shown in FIG. 7 that may be responsible for providing certain aspects of the wireless device's functionality, including any of the functionality described above and/or any additional functionality (including any functionality necessary to support the solution described above).

According to certain embodiments, a receiver within wireless network 100 may be configured generating soft information for code bits of polar codes. More specifically, a decoder within a receiver of a component of wireless network 100 may be configured to use the structure of the decoder to generate in the reverse direction LLRs of code bits from the relevant LLRs of the info bits. In a particular embodiment, the receiver may be a component or module of a network node 115. For example, the receiver for generating soft information for code bits of polar codes may be a component or module of transceiver 210 of network node 115. In a particular embodiment, transceiver 210 may include a decoder configured to generate soft information for code bits of polar codes, as disclosed herein. In another embodiment, the receiver may be a component or module of a wireless device 110. For example, the receiver for generating soft information for code bits of polar codes may be a component or module of transceiver 310 of wireless device 110. In a particular embodiment, transceiver 310 may include a decoder configured to generate soft information for code bits of polar codes, as disclosed herein.

Figure 1:
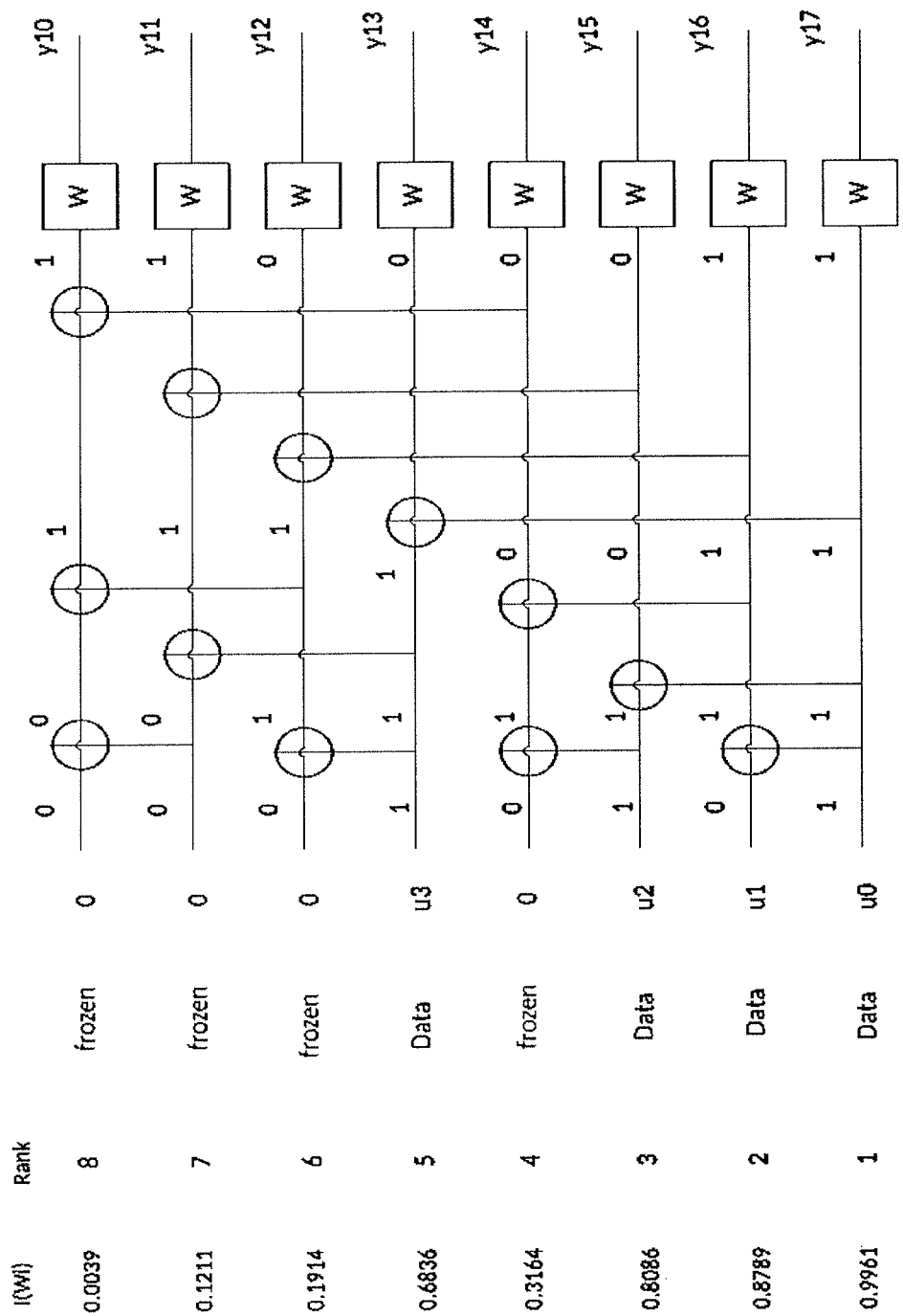
FIG. 1 illustrates the structure of a polar code with a length of eight.
Figure 2:
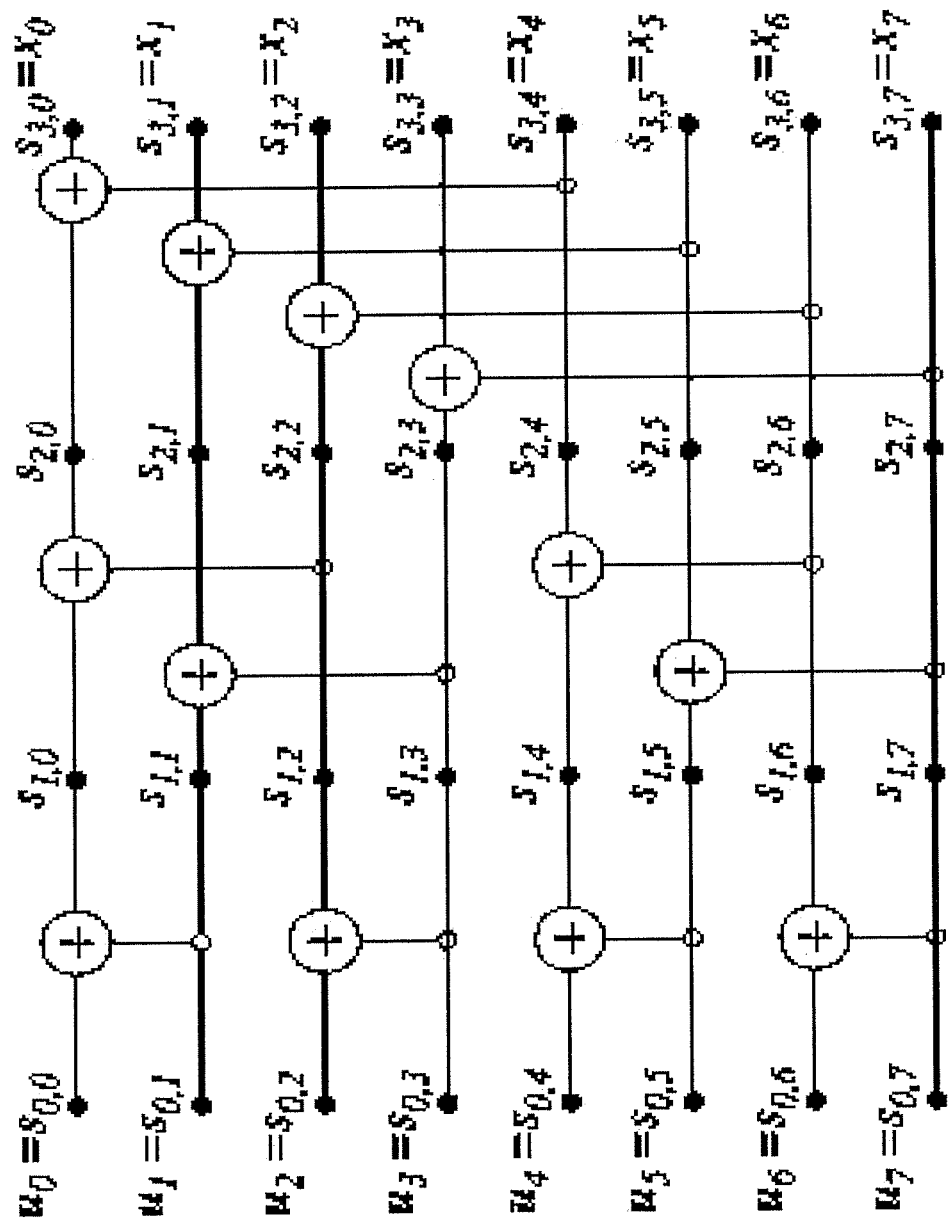
FIG. 2 illustrates the labeling of the intermediate info bits for a polar code with a length of eight.
Figure 3:
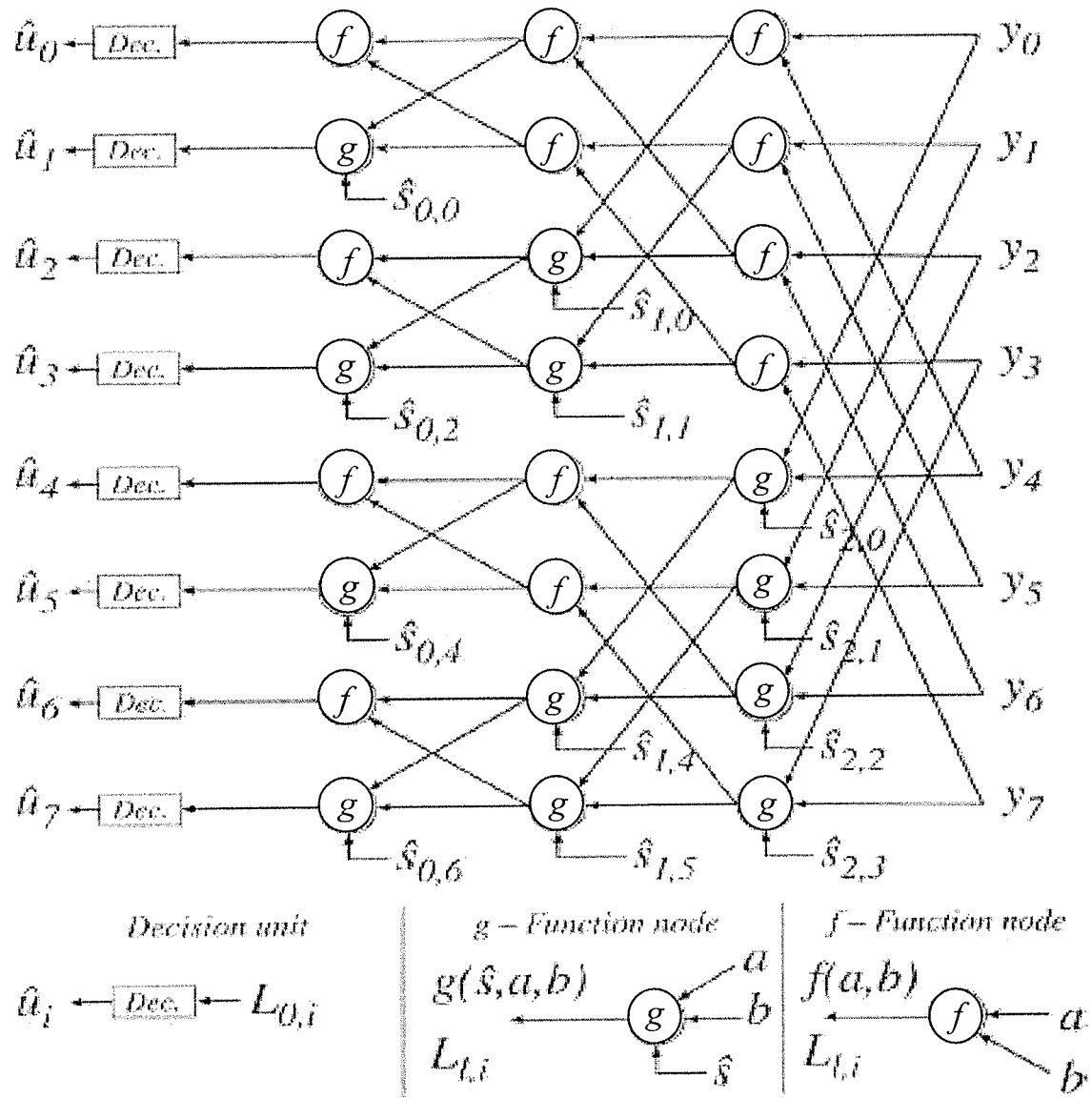
FIG. 3 illustrates a butterfly-based successive cancellation (SC) decoder with a length of eight.
Figure 4:
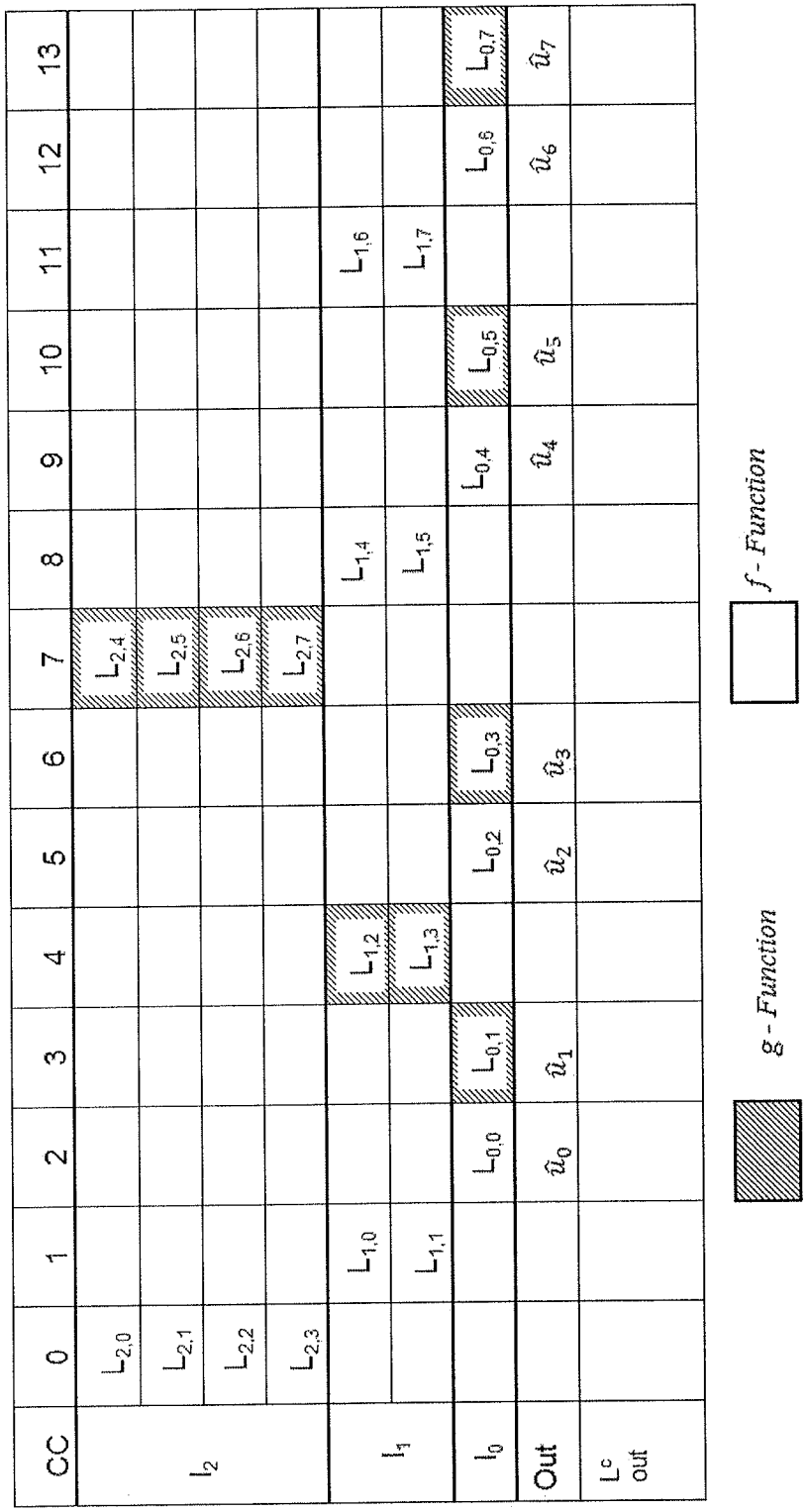
FIG. 4 illustrates exemplary scheduling for a butterfly-based SC decoder with a length of eight.

With regard to the computation of LLRs for info bits, in traditional SC or SCL decoding, the decoder takes the channel LLRs $\{L_{n,i}\}_{i \in \{0, 1, \ldots, 2^n - 1\}}$ from demodulator as input, where $$L_{n,i} \triangleq \ln \frac{Pr(x_i = 0 \mid y_i)}{Pr(x_i = 1 \mid y_i)}$$

and calculates info bit LLRs $\{L_{0,i}\}_{i \in \{0, 1, \ldots, 2^n - 1\}}$, where $$L_{0,i} \triangleq \ln \frac{Pr(u_i = 0 \mid y_0^{N-1}, \hat{u}_0^{i-1})}{Pr(u_i = 1 \mid y_0^{N-1}, \hat{u}_0^{i-1})}$$

and $\hat{u}_0^{i-1}$ denotes the hard info bits (or frozen bits) in $\{s_0, s_1, \ldots, s_{i-1}\}$. The calculation may be achieved by computing the following two functions:

$$L_{l-1,i} = f(L_{l,i}, L_{l,i+2^l}) \triangleq 2\tanh^{-1}\left(\tanh(L_{l,i}/2)\tanh(L_{l,i+2^l}/2)\right) \quad \text{if } B(l, i) = 0$$

$$L_{l-1,i} = g(\hat{s}_{l,i-2^l}, L_{l,i}, L_{l,i-2^l}) \triangleq (-1)^{\hat{s}_{l,i-2^l}} L_{l,i-2^l} + L_{l,i} \quad \text{if } B(l, i) = 1$$

within a Fast Fourier Transform-like structure illustrated in FIG. 3 and propagating LLRs from right (l=n) to left (l=0), where B(l,i) denotes the lth significant bit in the binary representation of i, and where $\hat{s}_{l,i}$ denotes the ith hard intermediate bits at stage l which is obtained by encoding the hard info bits and frozen bits whenever they become available according to $$s_{l+1,i} = s_{l,i} \oplus s_{l,i+2^l}, \text{ for}$$

$$i \in \left\{ j \in \{0, 1, \ldots, N-1\}: \mod\left(\left\lfloor \frac{j}{2^l} \right\rfloor, 2\right) = 0 \right\}$$

$$s_{l+1,i+2^l} = s_{l,i+2^l}, \text{ for}$$

$$i \in \left\{ j \in \{0, 1, \ldots, N-1\}: \mod\left(\left\lfloor \frac{j}{2^l} \right\rfloor, 2\right) = 1 \right\}$$

starting from left (l=0) to right (l=n), with $\hat{s}_{0,i} = \hat{u}_i$.

With regard to the computation of LLRs for code bits using a SC or SCL decoder, which are defined as $$L_{n,i} \triangleq \ln \frac{Pr(c_i = 0 \mid y_0^{N-1}, \hat{u}_0^{i-1})}{Pr(c_i = 1 \mid y_0^{N-1}, \hat{u}_0^{i-1})},$$

the LLRs of all info bits, together with the LLRs corresponding to the pre-set values of the frozen bits, are re-encoded into LLRs of code bits, as described below.

According to certain embodiments, if the preset value of frozen bits is zero, as typically assumed, the corresponding LLR of frozen bits may be set to a large positive number to approximate infinity. For example, the LLR of frozen bits may be set to 10e5. The re-encoding of the LLRs of the info bits and the frozen bits into LLRs of code bits is accomplished by traversing through the SC decoder in the reverse direction similar to how the hard decision values of info bits propagate during SC decoding, except that the following calculation of binary addition (i.e. binary value xor operation) in SC decoding $$s_{l+1,i} = s_{l,i} \oplus s_{l,i+2^l}, \text{ for}$$

$$i \in \left\{ j \in \{0, 1, \ldots, N-1\} \colon \mod\left(\left\lfloor \frac{j}{2^l} \right\rfloor, 2\right) = 0 \right\}$$

$$s_{l+1,i+2^l} = s_{l,i+2^l}, \text{ for}$$

$$i \in \left\{ j \in \{0, 1, \ldots, N-1\} \colon \mod\left(\left\lfloor \frac{j}{2^l} \right\rfloor, 2\right) = 1 \right\}$$

where $l \in \{0, 1, \ldots, n-1\}$, has to be replaced by LLR calculation of $f(\bullet, \bullet)$ function, in order to propagate the LLRs from info bits $\hat{u}_i$ to code bits $\hat{c}_i = \hat{s}_{n,i}$. Binary value xor operation, which does not take a clock cycle (CC), is replaced by real value calculation to evaluate $f(\bullet, \bullet)$ function. This requires real value processing unit, and also real value storage for the intermediate LLRs per stage. The real value calculation is:

$$L_{l+1,i}{}^c = f(L_{l,i}{}^c; L_{l,i+2^l}{}^c); \text{ if } B(l,i)=0$$

$$L_{l+1,i}{}^c = L_{l,i}{}^c; \text{ if } B(l,i)=1$$

for $\in \{0, 1, \ldots, N-1\}$, starting from left (l=0) to right (l=1). Thus, according to certain embodiments, after each $g(\bullet, \bullet, \bullet)$ function of depth 0 (l=0), i.e., reaching info bits $\hat{u}_i$, LLR of info bits $\hat{u}_i$ are propagated from left to right, in the direction of code bits $\hat{x}_i = \hat{s}_{n,i}$.

According to certain embodiments, the computation of code bit LLRs may be scheduled in at least two ways. The first is post-decoding computation. The second is integrated computation.

Figure 8:
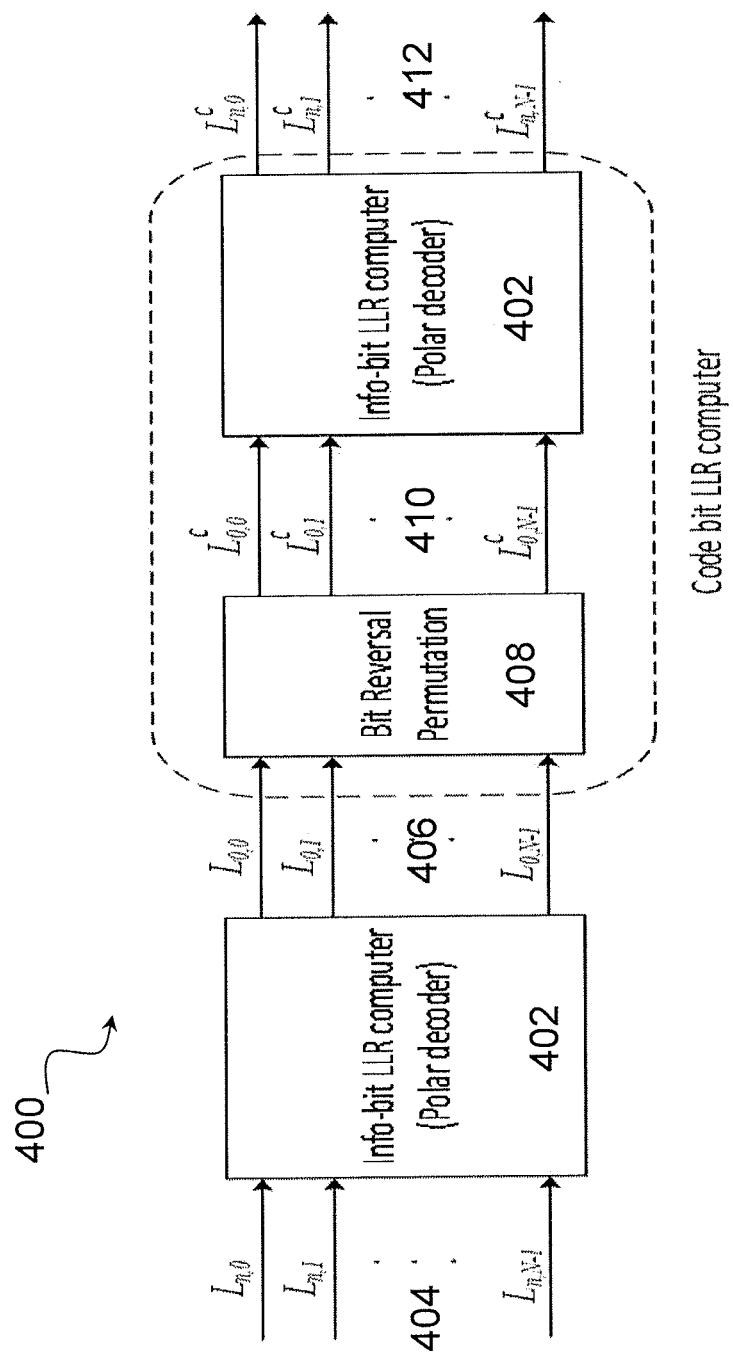
FIG. 8 illustrates an exemplary re-decoding architecture for computing log likelihood ratios (LLRs) for code bits, in accordance with certain embodiments.

Using a post-decoding computation scheduling scheme, the computation of LLRs for the code bits as described in the above equation is performed independently after the LLRs of all info bits have been computed. In such a scenario, the same decoding hardware that was used to generate the LLRs for the info bits can be reused to generate the LLRs for the code bits. FIG. 8 illustrates an exemplary re-decoding architecture 400 for computing the LLRs for code bits, in accordance with certain embodiments. As shown, architecture 400 includes polar decoder 402, which may be an info-bit LLR computer. The input to polar decoder 402 is channel LLRs 404. The output is LLRs of the info bits 406, which may also be called info bit LLRs 406. This output, together with the LLRs of frozen bits, are then used as input in a bit-reversal permutation 408 to generate permuted LLRs for the info bits 410. The permutated LLRs for the info bits 410 and frozen bits are then treated as if they are the channel LLRs and input into polar decoder 402 in the reverse direction. Thus, after the normal operations for computing the LLRs for the info bits are applied to the fictitious channel LLRs, the resulting LLRs for the info bit 406 are transformed into the LLRs for the code bits 412.

According to certain embodiments, the info bit LLR computation used by polar decoder 402 may employ SC or SCL decoding methods. For the case of SCL decoding, a set of info bit LLRs $\{L_{0,i}\}_{i \in \{0, 1, \ldots, N-1\}}$, info bit LLRs 406 in FIG. 8, may be stored for each path in the list of surviving paths, bit-reversally permuted, and used as input in info bit LLR computation again. The SCL decoding method can be used during the second pass of info bit LLR computation by maintaining L surviving paths. The output of info bit LLRs corresponding to the best path metric during the second pass of info bit LLR computation is to be considered as the final output of code bit LLRs 412.

An advantage of post-decoding computation may be simplicity. No additional computation logics are necessary for the calculation of LLRs for the code bits. With additional logics, however, the computation of info bit LLRs and code bit LLRs may be pipelined to increase the throughput. However, a disadvantage of post-decoding computation may be high latency. The latency incurred by the decoder is essentially doubled, since the code bit LLR calculation does not start until the LLRs are fully generated for info bits and frozen bits.

Figure 9:
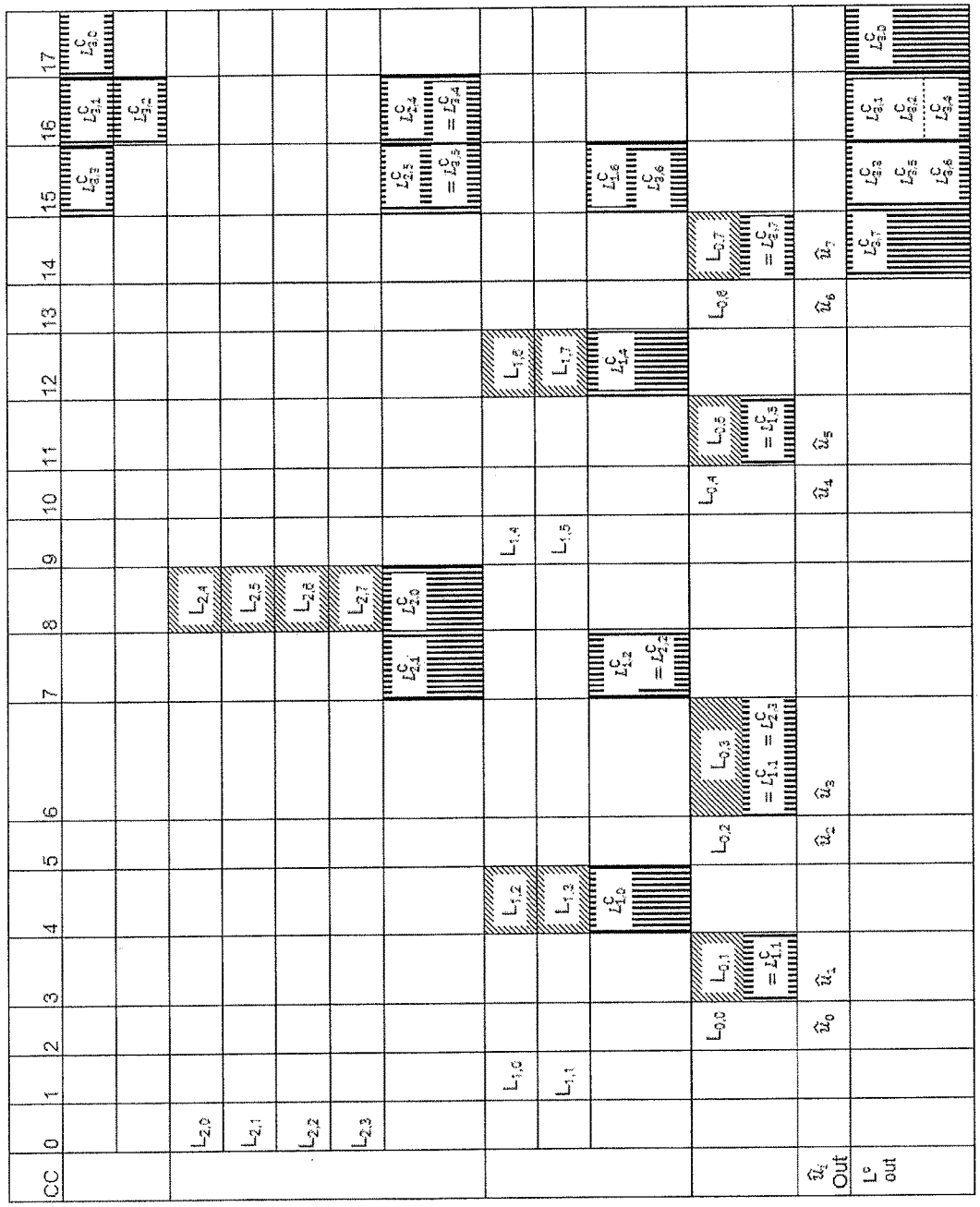
FIG. 9 illustrates example updated CC operations for integrated computation, according to certain embodiments.

Alternatively, to minimize latency due to code bit LLR generation, integrated computation may be used. FIG. 9 illustrates example updated CC operations for integrated computation, according to certain embodiments. Specifically, table 500 summarizes updated CC operations as compared to the CC operations discussed above with respect to FIG. 4. Again, CC, as used herein, refers to clock cycle. Within the table of FIG. 9, the following cells are associated with the $g(\bullet, \bullet, \bullet)$ operation in the basic SC: $L_{0,1}$, $L_{0,3}$, $L_{0,5}$, $L_{0,7}$, $L_{1,2}$, $L_{1,3}$, $L_{1,6}$, $L_{1,7}$, $L_{2,4}$, $L_{2,5}$, $L_{2,6}$, and $L_{2,7}$. Accordingly, the cells shown with the lighter, diagonal hatch in FIG. 9 show the info bit LLR generation. Conversely, the cells that are shown with the dark, vertical hatch show the code bit LLR generation, which is added to the basic SC. As shown in FIG. 9, some of the calculations of code bit LLRs during the reverse propagation (i.e. from left to right in FIG. 3) can start once the necessary LLRs of info bits have been generated.

The table is intended to show the fastest version of generating intermediate results; however, it is only one example of possible CC operations for integrated computation. Depending on the available processors for $f(\bullet, \bullet)$ function, some of the $L^c$ operations may be delayed until later to reduce the circuit requirement. For example, operation $L_{2,0}{}^c$ in CC 8 may be performed in CC 9 or CC 10.

FIG. 9 further demonstrates that:
 extra processing units should be added for the purpose of generating code bit LLRs;
 extra processing cycles are necessary compared to a decoder that does not generate code bit LLRs at all. As such, this may increase the decoding latency.

Possible simplifications in code bit LLR generation are possible. For example, systematic polar code may be used, according to certain embodiments. Specifically, the code bit LLR may only need to be calculated for the parity bits and may be omitted for the systematic bits. As another example, a punctured code bit simplification may be used. Specifically, there may be no need for code bit LLR generation for punctured code bits. However, if computational power permits, such a simplification may be undesirable since the LLRs of punctured code bits may benefit subsequent receiver processing. For example, the LLR of punctured code bits may lead to a better soft estimate of the signals of previously decoded data streams in a MIMO SIC receiver, in a particular embodiment.

As another possible simplification, sub-tree types may be utilized, in some embodiments. According to a particular embodiment, for example, Rate-0 nodes may include sub-trees whose leaf nodes all correspond to frozen bits. The code bit generation can be simplified to setting LLR=infinity (or a large positive value) in certain embodiments. As another example, repetition nodes may be used. In a repetition node, all leaf nodes may be frozen bits, with the exception of the node at the most significant position. The code bit generation can be simplified to copying the info bit LLR to be the code bit LLRs.

In certain embodiments, where list decoding of list size L is used, the additional complexity due to code bit LLR generation may also be multiplied by L times, in the straight-forward implementation way. Alternatively, in other embodiments, if extra latency can be tolerated, then the code bit LLR generation can wait till the best codeword is selected. In this case, only the code bit LLR according to the best codeword needs to be generated.

According to certain embodiments, if polar code is used as a constituent code of the encoding process of the transmitter, the soft output of polar coded bits may be utilized by other constituent codes in the decoder. FIG. 10 illustrates an encoder 600 in a transmitter for handling serially concatenated codes, according to certain embodiments. As depicted encoder 600 includes a first constituent code 602, an interleaver 604, and a second constituent code 606. In a particular embodiment, first constituent code 602 is a polar encoder. The polar code may be serially concatenated with a second code 606, where the output of polar encoder ($c_1$) is the input to a second code 606. Thus, the first constituent code 602 may be thought of as the outer code, while the second code 606 is thought of as the inner code. The second code 606 may or may not be a polar code.

FIG. 11 illustrates a decoder 700 in a receiver for handling serially concatenated codes, in accordance with certain embodiments. As depicted, decoder 700 includes a second constituent code 702, a de-interleaver 704, a first constituent code 706, and an interleaver 708. Again, first constituent code 706 may be thought of as the outer code, while second constituent code 702 is thought of as the inner code. In this example, the first constituent code includes a polar decoder 706, and second constituent decoder 702 may or may not be a polar decoder.

According to a particular embodiment, for example, $LLR^c_{in,2}$ is the channel LLR received from wireless channel for its channel bits c. $LLR^u_{out,2}$ is the info bit LLR generated by the second constituent decoder 702. $LLR^u_{out,2}$ is taken by the first constituent decoder 706 as channel bit LLR input, $LLR^c_{in,1}$. The first constituent decoder 706 generates info bit LLR output, $LLR^u_{out,1}$ and code bit LLR output, $LLR^c_{out,1}$. In the next iteration, $LLR^c_{out,1}$ is taken as info bit LLR input $LLR^u_{in,2}$ by the second constituent decoder 702.

Figure 12:
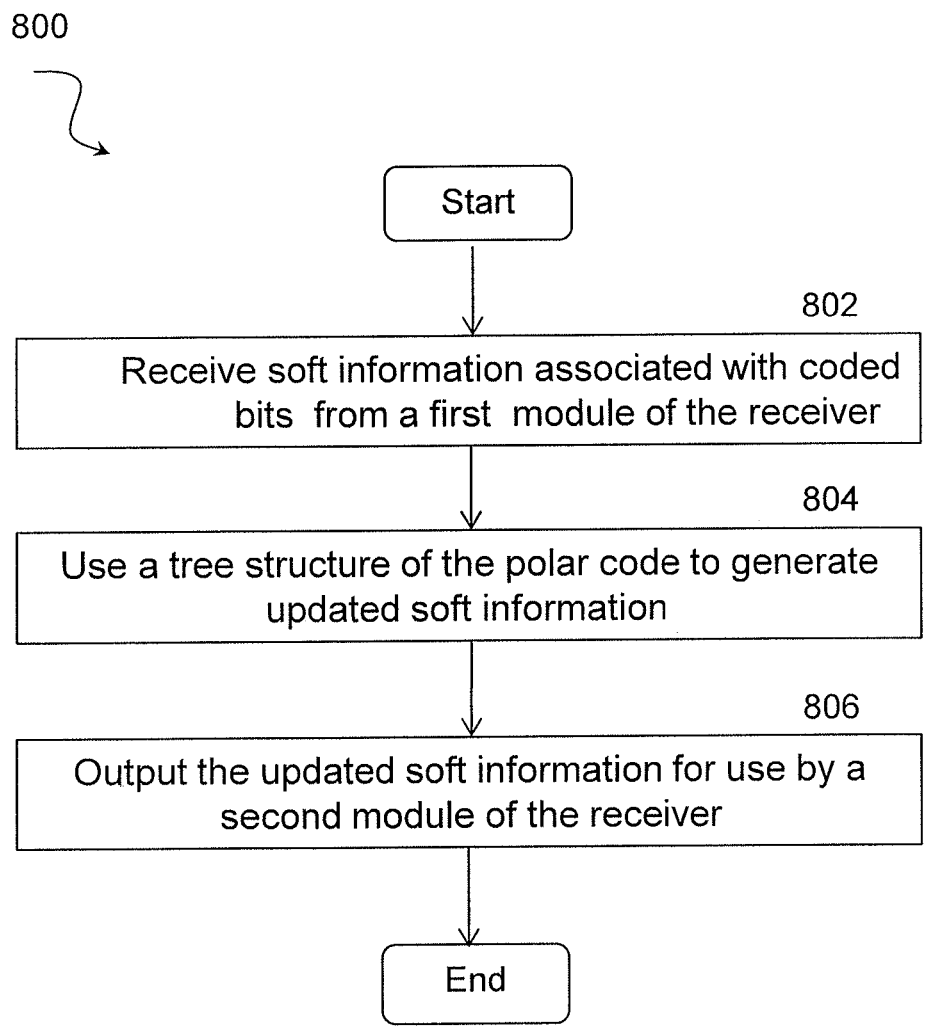
FIG. 12 illustrates an exemplary method by a receiver for generating soft information for code bits of polar codes, in accordance with certain embodiments.

FIG. 12 illustrates an exemplary method 800 by a receiver for generating soft information for code bits of polar codes, according to certain embodiments. In a particular embodiment, the receiver may be a component or module of a wireless node such as wireless node 110, discussed above. In another embodiment, the receiver may be a component or module of a network node such as network node 115, discussed above.

At step 802, a decoder of the receiver receives soft information associated with coded bits from a first module of the receiver. In a particular embodiment, the soft information comprises a plurality of log likelihood ratios (LLRs) of coded bits received by the decoder from the first module of the receiver.

At step 804, the decoder of the receiver uses a tree structure of the polar code to generate updated soft information. In a particular embodiment, the decoder may generate a plurality of LLRs of the info bits by traversing the LLRs of the coded bits through a tree structure of the polar code in a first direction. The LLRs of frozen bits may be set to large, positive or negative, values according to a plurality of respective pre-set values of the frozen bits. The LLRs of the info bits and the LLRs of the frozen bits may then be re-encoded. In a particular embodiment, wherein re-encoding the LLRs of the info bits includes reverse propagating the LLRs of the info bits and LLRs of the frozen bits into LLRs of the coded bits. This reverse propagation may include traversing through the tree structure of the decoder in a reversed direction relative to the first direction. In a particular embodiment, a binary-value xor operation, which does not take a clock cycle, may be replaced with a real value calculation that combines the plurality of LLRs of the info bits and the plurality of LLRS of the frozen bits.

In a particular embodiment, reverse propagating the LLRs of the info bits and LLRs of the frozen bits into LLRs of the coded bits may include performing bit-reversal re-ordering of the LLRs of the info bits to generate a plurality of re-ordered LLRs of the info bits. The re-ordered LLRs of the info bits may be used as the input of the decoder and the tree structure of the decoder may be traversed in the first direction.

In a particular embodiment, the tree structure of the polar code is used to generate the updated soft information after all of the soft information is received from the decoder. For example, the tree structure of the polar code may be used to generate the updated soft information of coded bits after all of the LLRs of info bits are generated. In another embodiment, the tree structure of the polar code may be used to begin generating the updated soft information before all of the soft information is received from the decoder. For example, generation of the updated soft information of coded bits may begin when some but not all of the LLRs of the info bits are generated.

At step 806, the decoder of the receiver outputs the updated soft information for use by a second module of the receiver.

Figure 13:
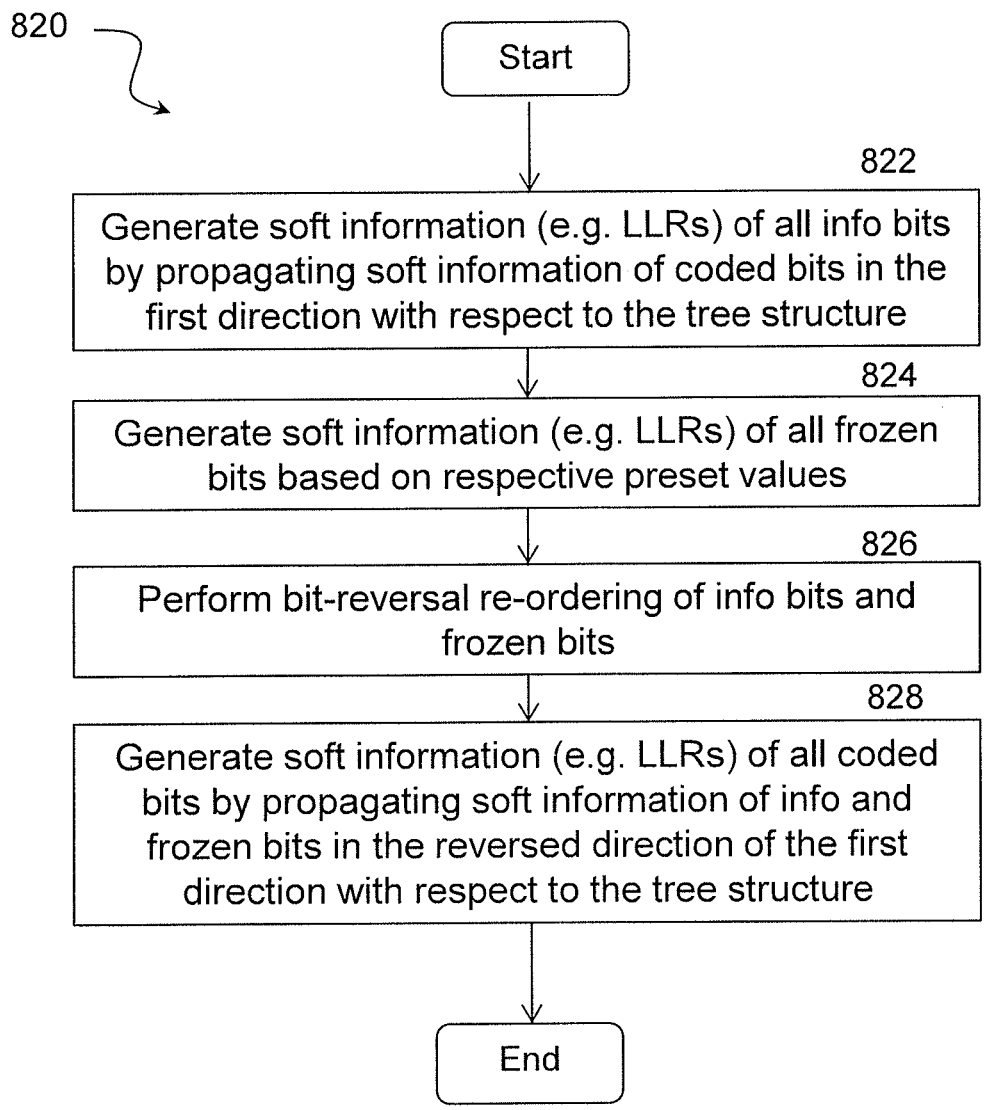
FIG. 13 illustrates an exemplary method by a receiver for using a tree structure of the polar code to generate updated soft information, according to certain embodiments.

FIG. 13 illustrates an exemplary method 820 by a receiver for using a tree structure of the polar code to generate updated soft information, according to certain embodiments. The method begins at step 822 when the decoder of the receiver generates soft information of all info bits by propagating soft information of coded bits in the first direction with respect to the tree structure. In a particular embodiment, for example, the decoder may generate LLRs of all info bits by propagating soft information of coded bits in the first direction.

At step 824, the decoder generate soft information of all frozen bits based on respective preset values. In a particular embodiment, for example, the decoder may generate LLRs of all frozen bits based on the preset values.

At step 826, the decoder performs bit-reversal re-ordering of the info bits and frozen bits. The decoder may then generate soft information of all coded bits by propagating soft information of the info bits and the frozen bits in a reverse direction relative to the first direction with respect to the tree structure. In a particular embodiment, for example, the decoder may generate LLRs of all coded bits by propagating soft information of the info bits and the frozen bits in a reverse direction relative to the first direction with respect to the tree structure.

Figure 14:
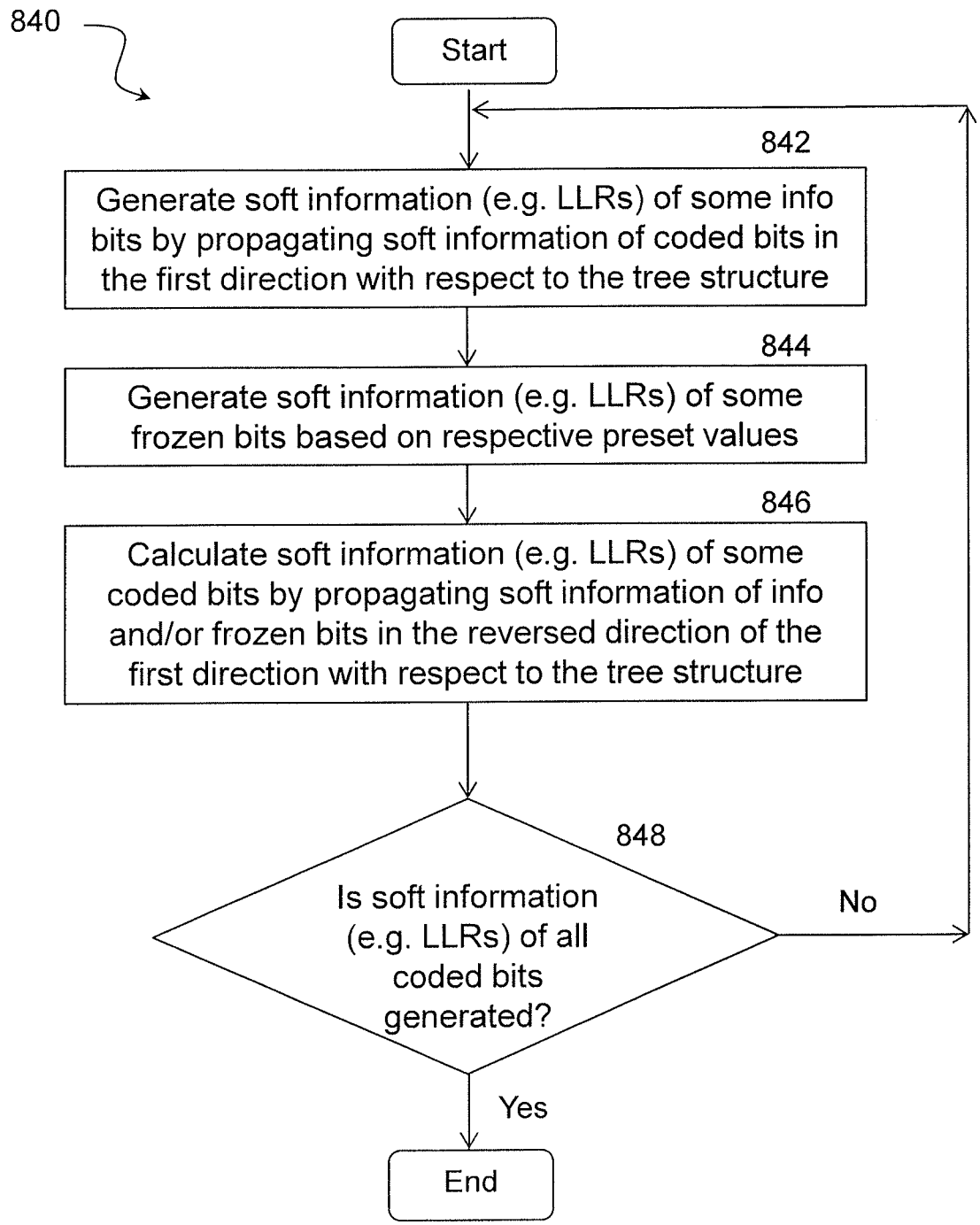
FIG. 14 illustrates another exemplary method by a receiver for using a tree structure of the polar code to generate updated soft information, according to certain embodiments.

FIG. 14 illustrates another exemplary method 840 by a receiver for using a tree structure of the polar code to generate updated soft information, according to certain embodiments. The method begins at step 842 when the decoder of the receiver generates soft information of some information bits by propagating soft information of coded bits in the first direction with respect to the tree structure. In a particular embodiment, the soft information includes LLRs of the info bits.

At step 844, the decoder of the receiver generates soft information of some frozen bits based on preset values for the respective frozen bits. In a particular embodiment, the decoder generates LLRs of the frozen bits.

At step 846, the decoder calculates soft information of some coded bits by propagating the soft information of the info bits and/or the frozen bits in a reverse direction relative to the first direction with respect to the tree structure. In a particular embodiment, for example, the decoder calculates LLRs of some coded bits.

At step 848, a determination is made as to whether the soft information of all coded bits has been generated. In a particular embodiment, for example, the decoder may determine if all of the LLRs of the coded bits have been generated. If it is determined that not all of the coded bits or LLRs of the coded bits have been generated, the method returns to step 842. Otherwise, the method ends.

Figure 15:
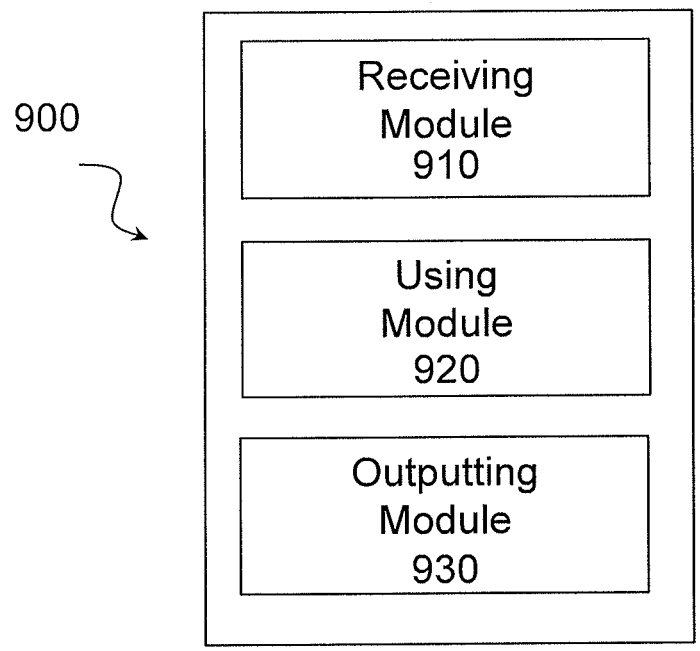
FIG. 15 illustrates an exemplary virtual computing device for generating soft information for code bits of polar codes, in accordance with certain embodiments.

In certain embodiments, the method for generating soft information for code bits of polar codes as described above may be performed by a virtual computing device. FIG. 15 illustrates an example virtual computing device 900 for generating soft information for code bits of polar codes, according to certain embodiments. In certain embodiments, virtual computing device 900 may include modules for performing steps similar to those described above with regard to the method illustrated and described in FIG. 12. For example, virtual computing device 900 may include a receiving module 910, a using module 920, a outputting module 930, and any other suitable modules for generating soft information for code bits of polar codes. In some embodiments, one or more of the modules may be implemented using processor or processing circuitry 220 of FIG. 6. In other embodiments, one or more of the modules may be implemented using processor or processing circuitry 320 of FIG. 7. In certain embodiments, the functions of two or more of the various modules may be combined into a single module.

The receiving module 910 may perform the receiving functions of virtual computing device 900. For example, in a particular embodiment, receiving module 910 may receive soft information associated with coded bits from a first module of the receiver. In a particular embodiment, the soft information may include LLRs of coded bits.

The using module 920 may perform the using functions of virtual computing device 900. For example, in a particular embodiment, using module 920 may use a tree structure of the polar code to generate updated soft information. In a particular embodiment, using module 920 may generate a plurality of LLRs of the info bits by traversing the LLRs of the coded bits through a tree structure of the polar code in a first direction. The LLRs of frozen bits may be set to large, positive or negative, values according to a plurality of respective pre-set values of the frozen bits. The LLRs of the info bits and the LLRs of the frozen bits may then be re-encoded by traversing through the tree structure of the decoder in a reversed direction relative to the first direction.

The outputting module 930 may perform the outputting functions of virtual computing device 900. For example, in a particular embodiment, outputting module 930 may output the updated soft information for use by a second module of the receiver.

Other embodiments of virtual computing device 900 may include additional components beyond those shown in FIG. 15 that may be responsible for providing certain aspects of the radio node's functionality, including any of the functionality described above and/or any additional functionality (including any functionality necessary to support the solutions described above). The various different types of radio nodes may include components having the same physical hardware but configured (e.g., via programming) to support different radio access technologies, or may represent partly or entirely different physical components.

Figure 16:
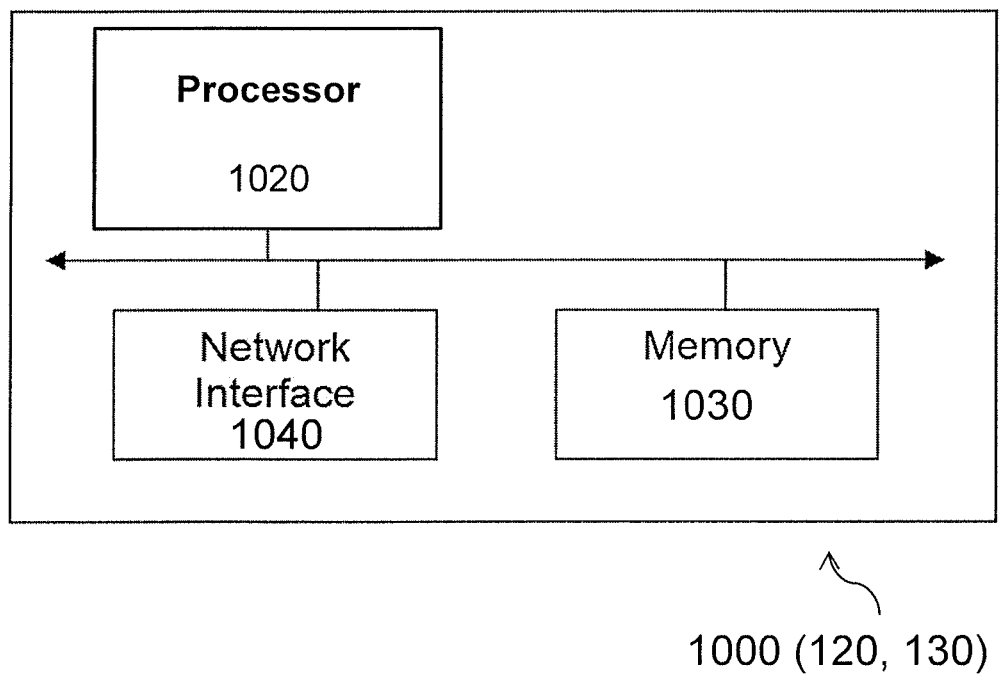
FIG. 16 illustrates an exemplary radio network controller or core network node, in accordance with certain embodiments.

FIG. 16 illustrates an exemplary radio network controller or core network node, in accordance with certain embodiments. Examples of network nodes can include a mobile switching center (MSC), a serving GPRS support node (SGSN), a mobility management entity (MME), a radio network controller (RNC), a base station controller (BSC), and so on. The radio network controller or core network node 1000 include processor 1020, memory 1030, and network interface 040. In some embodiments, processor 1020 executes instructions to provide some or all of the functionality described above as being provided by the network node, memory 1030 stores the instructions executed by processor 1020, and network interface 1040 communicates signals to any suitable node, such as a gateway, switch, router, Internet, Public Switched Telephone Network (PSTN), network nodes 115, radio network controllers or core network nodes 1000, etc.

Processor 1020 may include any suitable combination of hardware and software implemented in one or more modules to execute instructions and manipulate data to perform some or all of the described functions of the radio network controller or core network node 1000. In some embodiments, processor 1020 may include, for example, one or more computers, one or more central processing units (CPUs), one or more microprocessors, one or more applications, and/or other logic.

Memory 1030 is generally operable to store instructions, such as a computer program, software, an application including one or more of logic, rules, algorithms, code, tables, etc. and/or other instructions capable of being executed by a processor. Examples of memory 1030 include computer memory (for example, Random Access Memory (RAM) or Read Only Memory (ROM)), mass storage media (for example, a hard disk), removable storage media (for example, a Compact Disk (CD) or a Digital Video Disk (DVD)), and/or or any other volatile or non-volatile, non-transitory computer-readable and/or computer-executable memory devices that store information.

In some embodiments, network interface 1040 is communicatively coupled to processor 1020 and may refer to any suitable device operable to receive input for the network node, send output from the network node, perform suitable processing of the input or output or both, communicate to other devices, or any combination of the preceding. Network interface 1040 may include appropriate hardware (e.g., port, modem, network interface card, etc.) and software, including protocol conversion and data processing capabilities, to communicate through a network.

Other embodiments of the network node may include additional components beyond those shown in FIG. 14 that may be responsible for providing certain aspects of the network node's functionality, including any of the functionality described above and/or any additional functionality (including any functionality necessary to support the solution described above).

According to certain embodiments, a method is provided for generating soft information for code bits of polar codes. The method includes receiving, by a decoder of a receiver, soft information associated with coded bits from a first module of the receiver and using a tree structure of the polar code to generate updated soft information. The updated soft information is output by the decoder for use by a second module of the receiver.

According to certain embodiments, a decoder in a receiver for the soft output generation for code bits of polar codes is provided. The decoder includes memory storing instructions and processing circuitry operable to execute the instructions to cause the decoder to receive soft information associated with coded bits from a first module and use a tree structure of the polar code to generate updated soft information. The updated soft information is output by a decoder of the receiver for use by a second module of the receiver.

According to certain other embodiments, a method is provided for the soft output generation for code bits of polar codes. The method includes receiving LLR s of info bits from a decoder and reverse propagating the LLRs of the info bits into LLRs of code bits. Optionally, a binary value xor operation, which does not take a clock cycle, is replaced with a real value calculation. Optionally, the real value calculation is stored. Optionally, the LLRs of the info bits are reverse propagated together with preset values of frozen bits. Optionally, re-encoding the LLRs of the info bits and the preset values of frozen bits are re-encoded.

According to certain embodiments, an apparatus is provided for the soft output generation for code bits of polar codes. The apparatus includes a memory storing instructions and a processor operable to execute the instructions to cause the processor to receive LLR s of info bits from a decoder and reverse propagate the LLRs of the info bits into LLRs of code bits. Optionally, a binary value xor operation, which does not take a clock cycle, is replaced with a real value calculation. Optionally, the real value calculation is stored. Optionally, the LLRs of the info bits are reverse propagated together with preset values of frozen bits. Optionally, re-encoding the LLRs of the info bits and the preset values of frozen bits are re-encoded.

Certain embodiments of the present disclosure may provide one or more technical advantages. For example, certain embodiments may allow the soft output of polar coded bits to be utilized by other processors in the receiver. Another technical advantage may be that if polar code is used as a constituent code of the encoding process of the transmitter, the soft output of polar coded bits can be utilized by other constituent codes in the decoder. Still another technical advantage may be that the soft output of the coded bits is necessary for MIMO successive interference cancellation (SIC) receivers. In addition to MIMO SIC receivers, soft output of coded bits may also be used in advanced receivers with iterative demodulation and decoding, where the soft outputs between the demodulator and the channel decoder are iteratively exchanged to approach the performance of joint demodulation and decoding. For example, the soft coded bits can be used as a priori information when the demodulation attempts to improve its detection performance through re-demodulation of the received signal.

Modifications, additions, or omissions may be made to the systems and apparatuses described herein without departing from the scope of the disclosure. The components of the systems and apparatuses may be integrated or separated. Moreover, the operations of the systems and apparatuses may be performed by more, fewer, or other components. Additionally, operations of the systems and apparatuses may be performed using any suitable logic comprising software, hardware, and/or other logic. As used in this document, "each" refers to each member of a set or each member of a subset of a set.

Modifications, additions, or omissions may be made to the methods described herein without departing from the scope of the disclosure. The methods may include more, fewer, or other steps. Additionally, steps may be performed in any suitable order.

Although this disclosure has been described in terms of certain embodiments, alterations and permutations of the embodiments will be apparent to those skilled in the art. Accordingly, the above description of the embodiments does not constrain this disclosure. Other changes, substitutions, and alterations are possible without departing from the spirit and scope of this disclosure, as defined by the following claims.

The invention claimed is:

1. A method in a receiver for generating soft information for code bits of polar codes, the method comprising:
   receiving, by a decoder of the receiver, soft information associated with coded bits;
   using, by the decoder, a tree structure of the polar code to generate updated soft information; and
   outputting, by the decoder of the receiver, the updated soft information.

2. The method of claim 1, wherein the soft information comprises a plurality of log likelihood ratios (LLRs) of coded bits received by the decoder.

3. The method of claim 2, wherein using the tree structure of the polar code to generate the updated soft information comprises:
   generating a plurality of LLRs of the info bits by traversing the plurality of LLRs of the coded bits through the tree structure of the polar code in a first direction;
   setting a plurality of LLRs of frozen bits to large, positive or negative, values according to a plurality of respective pre-set values of the frozen bits;
   re-encoding the plurality of LLRs of the info bits and the plurality of LLRs of the frozen bits.

4. The method of claim 3, wherein re-encoding the plurality of the LLRs of the info bits comprises:
   reverse propagating the plurality of LLRs of the info bits and the plurality of LLRs of the frozen bits into the plurality of LLRs of the coded bits.

5. The method of claim 4, where in reverse propagating the plurality of LLRs of the info bits and the plurality of LLRs of the frozen bit into the plurality of LLRs of the coded bits comprise:
   traversing through the tree structure of the decoder in a reversed direction relative to the first direction.

6. The method of claim 5, wherein re-encoding the plurality of the LLRs of the info bits comprises:
   replacing a binary-value xor operation, which does not take a clock cycle with a real value calculation that combines the plurality of LLRs of the info bits and the plurality of LLRS of the frozen bits.

7. The method of claim 4, wherein reverse propagating the plurality of LLRs of the info bits and the plurality of LLRS of the frozen bits into the plurality of LLRs of the coded bits comprises:
  performing bit-reversal re-ordering of the plurality of LLRs of the info bits generate a plurality of re-ordered LLRS of the info bits;
  using the plurality of re-ordered LLRs of the info bits as the input of the decoder; and
  traversing through the tree structure of the decoder in the first direction.

8. The method of claim 1, wherein the tree structure of the polar code is used to generate the updated soft information after all of the soft information is received from the decoder.

9. The method of claim 1, wherein the tree structure of the polar code is used to begin generating the updated soft information before all of the soft information is received from the decoder.

10. The method of claim 1, wherein the tree structure of the polar code is used to generate the updated soft information of coded bits after all of the LLRs of info bits are generated.

11. The method of claim 1, wherein the tree structure of the polar code is used to begin generating the updated soft information of coded bits when some but not all of the plurality of LLRs of the info bits are generated.

12. The method of claim 1, wherein reverse propagation of the plurality of LLRs of the info bits begins when the plurality of LLRs of the info bits that correspond to a plurality of respective leave nodes of a sub-tree in the tree structure of the polar code are generated.

13. The method of claim 1 wherein the receiver comprises a network node.

14. The method of claim 1, wherein the receiver comprises a wireless device.

15. A decoder in a receiver for the soft output generation for code bits of polar codes, the decoder comprising:
  memory storing instructions; and
  processing circuitry operable to execute the instructions to cause the decoder to:
  receive soft information associated with coded bits;
  use a tree structure of the polar code to generate updated soft information; and
  output the updated soft information.

16. The decoder of claim 15, wherein the soft information comprises a plurality of log likelihood ratios (LLRs) of coded bits received by the decoder.

17. The decoder of claim 16, wherein, when using the tree structure of the polar code to generate the updated soft information, the decoder is operable to:
  generate a plurality of LLRs of the info bits by traversing the plurality of LLRs of the coded bits through the tree structure of the polar code in a first direction;
  set a plurality of LLRs of frozen bits to large, positive or negative, values according to a plurality of respective pre-set values of the frozen bits; and
  re-encode the plurality of LLRs of the info bits and the plurality of LLRs of the frozen bits.

18. The decoder of any one of claim 17, wherein, when re-encoding the plurality of the LLRs of the info bits, the decoder is operable to:
  reverse propagate the plurality of LLRs of the info bits and the plurality of LLRs of the frozen bits into the plurality of LLRs of the coded bits.

19. The decoder of claim 18, where, when reverse propagating the plurality of LLRs of the info bits and the plurality of LLRs of the frozen bit into the plurality of LLRs of the coded bits, the decoder is operable to:
  traverse through the tree structure of the decoder in a reversed direction relative to the first direction.

20. The decoder of claim 19, wherein, when re-encoding the plurality of the LLRs of the info bits, the decoder is operable to:
  replace a binary-value xor operation, which does not take a clock cycle with a real value calculation that combines the plurality of LLRs of the info bits and the plurality of LLRS of the frozen bits.

21. The decoder of claim 18, wherein, when reverse propagating the plurality of LLRs of the info bits and the plurality of LLRS of the frozen bits into the plurality of LLRs of the coded bits, the decoder is operable to:
  perform bit-reversal re-ordering of the plurality of LLRs of the info bits to generate a plurality of re-ordered LLRS of the info bits;
  use the plurality of re-ordered LLRs of the info bits as the input of the decoder; and
  traverse through the tree structure of the decoder in the first direction.

22. The decoder of claim 15, wherein the tree structure of the polar code is used to generate the updated soft information after all of the soft information is received from the decoder.

23. The decoder of claim 15, wherein the tree structure of the polar code is used to begin generating the updated soft information before all of the soft information is received from the decoder.

24. The decoder of claim 15, wherein the tree structure of the polar code is used to generate the updated soft information of coded bits after all of the LLRs of info bits are generated.

25. The decoder of claim 15, wherein the tree structure of the polar code is used to begin generating the updated soft information of coded bits when some but not all of the plurality of LLRs of the info bits are generated.

26. The decoder of claim 15, wherein reverse propagation of the plurality of LLRs of the info bits begins when the plurality of LLRs of the info bits that correspond to a plurality of respective leave nodes of a sub-tree in the tree structure of the polar code are generated.

27. The decoder of claim 15, wherein the receiver comprises a network node.

28. The decoder of claim 15, wherein the receiver comprises a wireless device.

* * * * *